(12) United States Patent
Kent

(10) Patent No.: US 9,929,130 B2
(45) Date of Patent: Mar. 27, 2018

(54) CHIP ON CHIP ATTACH (PASSIVE IPD AND PMIC) FLIP CHIP BGA USING NEW CAVITY BGA SUBSTRATE

(71) Applicant: Dialog Semiconductor GmbH, Kirchheim/Tech-Nabern (DE)

(72) Inventor: Ian Kent, Calne (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 15/299,910

(22) Filed: Oct. 21, 2016

(65) Prior Publication Data

US 2017/0040309 A1 Feb. 9, 2017

Related U.S. Application Data

(62) Division of application No. 13/790,437, filed on Mar. 8, 2013, now abandoned.

(30) Foreign Application Priority Data

Mar. 4, 2013 (EP) .................................. 13368005

(51) Int. Cl.
*H01L 21/56* (2006.01)
*H01L 25/00* (2006.01)
(Continued)

(52) U.S. Cl.
CPC ............ *H01L 25/50* (2013.01); *H01L 21/563* (2013.01); *H01L 21/565* (2013.01); *H01L 23/13* (2013.01); *H01L 23/293* (2013.01); *H01L 23/3128* (2013.01); *H01L 23/49816* (2013.01); *H01L 23/49866* (2013.01); *H01L 23/49894* (2013.01); *H01L 24/17* (2013.01); *H01L 24/81* (2013.01); *H01L 25/0657* (2013.01); *H01L 25/16* (2013.01); *H01L 24/13* (2013.01); *H01L 24/16* (2013.01); *H01L 24/32* (2013.01);
(Continued)

(58) Field of Classification Search
CPC ..... H01L 21/56; H01L 21/563; H01L 21/565; H01L 2224/1703; H01L 2224/13147; H01L 2224/16145; H01L 2224/181
USPC .......................... 438/108, 109, 112, 124, 127
See application file for complete search history.

(56) References Cited

U.S. PATENT DOCUMENTS 6,084,308 A 7/2000 Kelkar et al.
6,239,484 B1 * 5/2001 Dore ..................... H01L 21/563
257/687

(Continued)

FOREIGN PATENT DOCUMENTS

EP 2 234 158 9/2010

OTHER PUBLICATIONS

European Search Report, Application No. 16188226.1-1552, Applicant: Dialog Semiconductor GmbH, dated Jan. 18, 2017, 7 pgs.

*Primary Examiner* — Chuong A Luu
(74) *Attorney, Agent, or Firm* — Saile Ackerman LLC; Stephen B. Ackerman; Rosemary L.S. Pike

(57) ABSTRACT

An integrated passive device and power management integrated circuit are directly connected, active surface to active surface, resulting in a pyramid die stack. The die stack is flip-chip attached to a laminate substrate having a cavity drilled therein wherein the smaller die fits into the cavity. The die to die attach is not limited to IPD and PMIC and can be used for other die types as required.

20 Claims, 2 Drawing Sheets

(51) Int. Cl.
*H01L 23/00* (2006.01)
*H01L 23/13* (2006.01)
*H01L 23/31* (2006.01)
*H01L 25/065* (2006.01)
*H01L 25/16* (2006.01)
*H01L 23/29* (2006.01)
*H01L 23/498* (2006.01)

(52) U.S. Cl.
CPC .... *H01L 24/73* (2013.01); *H01L 2224/13147* (2013.01); *H01L 2224/16145* (2013.01); *H01L 2224/16225* (2013.01); *H01L 2224/16265* (2013.01); *H01L 2224/1703* (2013.01); *H01L 2224/32225* (2013.01); *H01L 2224/73204* (2013.01); *H01L 2225/06513* (2013.01); *H01L 2225/06517* (2013.01); *H01L 2225/06568* (2013.01); *H01L 2924/12042* (2013.01); *H01L 2924/15156* (2013.01); *H01L 2924/15311* (2013.01); *H01L 2924/15313* (2013.01); *H01L 2924/181* (2013.01); *H01L 2924/18161* (2013.01); *H01L 2924/19011* (2013.01); *H01L 2924/19041* (2013.01); *H01L 2924/19042* (2013.01); *H01L 2924/19043* (2013.01); *H01L 2924/19051* (2013.01); *H01L 2924/19104* (2013.01)

(56) References Cited

U.S. PATENT DOCUMENTS

| | | |
|---|---|---|
| 6,265,771 B1 | 7/2001 | Ference et al. |
| 6,272,020 B1 | 8/2001 | Tosaki et al. |
| 6,659,512 B1 * | 12/2003 | Harper ............... H01L 25/0657 257/777 |
| 7,835,157 B2 | 11/2010 | Tilmans et al. |
| 7,915,084 B2 | 3/2011 | Hong |
| 8,222,717 B2 | 7/2012 | Shim et al. |
| 2005/0104211 A1 | 5/2005 | Baba |
| 2008/0142961 A1 | 6/2008 | Jones et al. |
| 2010/0327424 A1 | 12/2010 | Braunisch et al. |

* cited by examiner

CHIP ON CHIP ATTACH (PASSIVE IPD AND PMIC) FLIP CHIP BGA USING NEW CAVITY BGA SUBSTRATE This is a divisional application of U.S. Ser. No. 13/790,437 filed on Mar. 8, 2013 now Abandonment, assigned to the same assignee as the instant application, and which is herein incorporated by reference in its entirety.

TECHNICAL FIELD

This disclosure is related to flip chip attachment of Mother die and Daughter Integrated Passive Device die, and more particularly, to methods of flip chip attachment of Mother die and Daughter Integrated Passive Device die in an inverted pyramid die stack, using a laser drilled cavity laminate Ball Grid Array/Land Grid Array substrate to accommodate the protruding Daughter die.

BACKGROUND

Passive device integration is typically done by:
1) Back side on active side die stacking with wire bond interconnection,
2) Surface Mount of the passive to the top layer of a laminate substrate, or
3) Embedding large passive components into a printed circuit board.

The limitations of these methods prevent direct electrical connection between mother and daughter die, followed by the flip chip attach of the resulting inverted die stack onto a Ball Grid Array (BGA) or Land Grid Array (LGA) laminate substrate. Direct connection would allow for better electrical performance and printed circuit board (PCB) real estate reduction by integrating passives off the PCB and into the package.

In the past, substrate technologies were limited with respect to the ability to laser or mechanically drill a cavity into a laminate substrate having a Bismaleimide Triazine (BT) core while maintaining mechanical and reliability integrity. With the advancements in substrate manufacturing technology, it is now possible to manufacture substrates with mechanically drilled or lasered cavities.

U.S. Pat. Nos. 7,915,084 (Hong), 8,222,717 (Shim et al), and 7,835,157 (Tilmans) discuss integrated passive devices, but these are completely different die stacking and die to substrate interconnection and package types from those in the present disclosure.

SUMMARY

It is the primary objective of the present disclosure to provide a new integration method for inverted pyramid die stack using flip chip attachment to a BGA or LGA laminate cavity substrate.

Yet another objective is to use a die on die attachment to produce direct contact of a Mother die to a Daughter die.

In accordance with the objectives of the present disclosure, a method of fabricating a mother and daughter integrated circuit is achieved. A mother die and a daughter die, wherein the daughter die is smaller than the mother die, are directly connected, active surface to active surface, resulting in a die stack. The die stack is flip-chip attached to a substrate having a cavity drilled therein wherein the daughter die fits into the cavity.

Also in accordance with the objectives of the present disclosure, a method of fabricating an integrated passive device is achieved. An integrated passive device and power management integrated circuit are directly connected, active surface to active surface, resulting in a die stack. The die stack is flip-chip attached to a substrate having a cavity drilled therein wherein the smaller die fits into the cavity.

Also in accordance with the objectives of the present disclosure, an mother and daughter integrated circuit is achieved. A mother die and a daughter die, wherein the daughter die is smaller than the mother die, are directly connected, active surface to active surface, resulting in a pyramid die stack. The pyramid die stack is flip-chip attached to a substrate having a cavity drilled therein wherein the daughter die fits into the cavity.

BRIEF DESCRIPTION OF THE DRAWINGS

In the accompanying drawings forming a material part of this description, there is shown.

DETAILED DESCRIPTION

The present disclosure is a process integration method of fabricating chip on chip using flip chip attachment and a cavity substrate. For example, this method can be used for passive and power management integrated circuit (PMIC) devices. The Daughter die, such as an integrated passive device (IPD) chip, is attached under the Mother die, such as a power management chip, resulting in an inverted pyramid die stack once flipped onto the cavity substrate. Since the daughter chip protrudes below the interconnects of the mother chip, it needs a cavity substrate for flip chip attachment. The die on die attach capability produces direct contact between the mother and daughter chips.

This package technology has recently become viable due to:
1) Availability of the IPD die, and
2) Laminate cavity substrate as opposed to the use of standard surface mount passives.

Higher accuracy drilling capabilities of substrate suppliers are essential to this technology. Higher drilling accuracy minimizes cavity sizes to prevent potential package XY dimension increase for integration into existing products. Package XY dimension is critical in order to reduce end printed circuit board (PCB) space which is at a premium and very cost sensitive.

Advancements in substrate drilling systems and tools prevent mechanical vibration resulting in mechanical damage and substrate layer separation which can lead to package delamination and reliability failures and permits the laser drilling of cavities in laminate substrates.

Referring now more particularly to FIGS. 1-5, a preferred integration method will be described.

The present disclosure provides a new process integration for fabricating chip on chip using flip chip attachment and a cavity substrate. For example, these may be passive and power management integrated circuit (PMIC) devices, but the method is not limited to only these types of devices. For illustration purposes, the mother chip will be a power management chip and the daughter chip will be an integrated passive device, for example.

Figure 2:
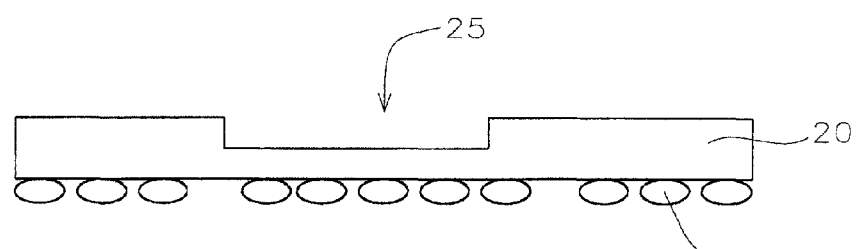
FIG. 2 is a cross-sectional representation of the substrate in FIG. 1, having the cavity therein.
Figure 3:
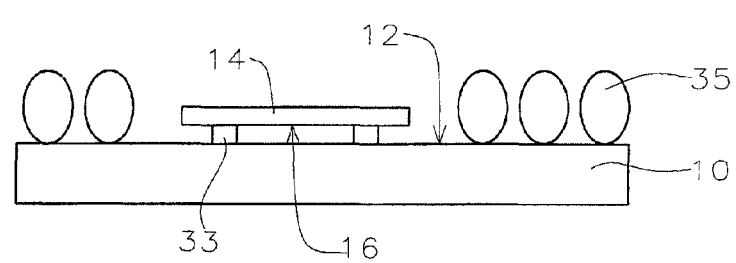
FIG. 3 is a cross-sectional representation of a die stack showing die to die interconnection.

Referring now to FIG. 3, there is shown
1) Mother chip 10, which may be a power management chip.
2) Daughter chip 14, which may be an IPD chip.
3) Active surface of the IPD chip 16 being attached to the active surface of the power management chip 12 using micro bump 33.
4) The copper pillar interconnect 35 for the power management chip to attach the pyramid die stack to the laminate substrate 20 (FIG. 2).

Figure 4:
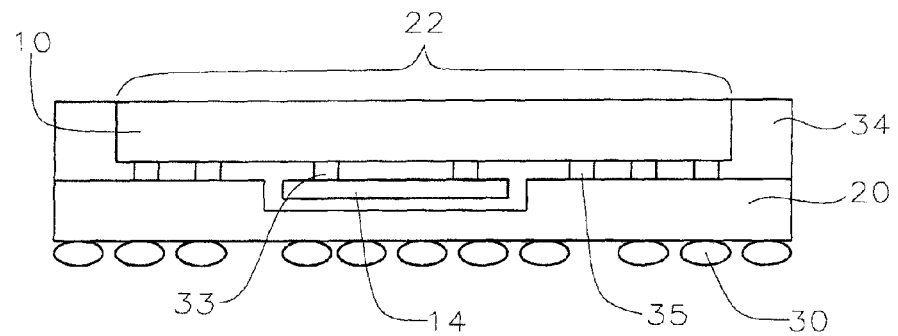
FIG. 4 is a cross-sectional representation of a flip chip attachment of the substrate and the die stack of FIGS. 2 and 3, respectively.

The IPD chip could be a capacitor array or other passives such as resistors, inductors, baluns, or filters, or the like. The direct electrical connections between the active surfaces of the two dies 10 and 14, using micro bump 33, result in better electrical performance than non-direct connections, such as wire bonding or passive surface mount and connection via laminate substrate copper trace. The die on die attach results in the flip chip attach of the pyramid die stack as shown in FIG. 4.

The IPD die is smaller than the PMIC die in all dimensions, i.e. length, width, and height directions. The IPD die size can vary depending upon the number of passives required. The smaller IPD die, when attached to the PMIC die, then results in a pyramid die stack configuration.

FIG. 2. illustrates a laminate substrate 20 having solder balls 30 on the underside of the substrate. Solder balls are required for BGA packages, but this cavity substrate technology is also applicable for LGA packages where solder balls are not attached. The substrate 20 has been laser drilled to form cavity 25.

Advancements in substrate drilling techniques and tools allow for the laser drilling of this small cavity 25 without increasing the package dimension and without causing mechanical damage or substrate layer separation.

Figure 1:
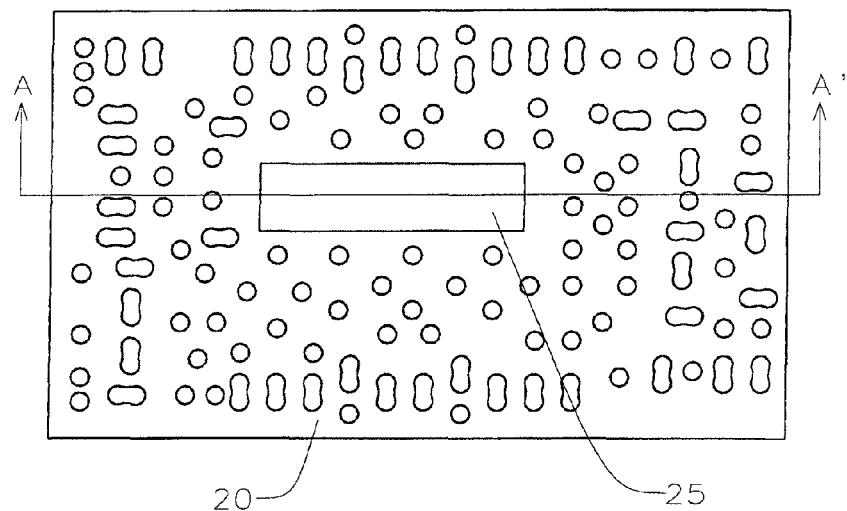
FIG. 1 is a top view of a substrate having a cavity therein.

FIG. 1 illustrates a top view of the substrate shown in cross-section view A-A' in FIG. 2. Rectangular cavity 25 is shown.

The die on die attached chips shown in FIG. 3 are flipped resulting in an inverted pyramid die stack 22 as shown in FIG. 4. Now the die stack 22 is connected to the BGA substrate 20 via the copper pillars 35 using a flip chip attach method. The passive IPD die 14 protrudes below the interconnects 35 of the mother die 10. It fits into the cavity 25 drilled into the substrate 20, but is not connected to the substrate 20.

This method can be applied for some existing products by re-routing substrate metal traces in the laminate substrate to make space available for the cavity. This is only a slight change as compared to the standard substrate. Alternatively, the cavity can be designed into new laminate substrates.

Figure 5:
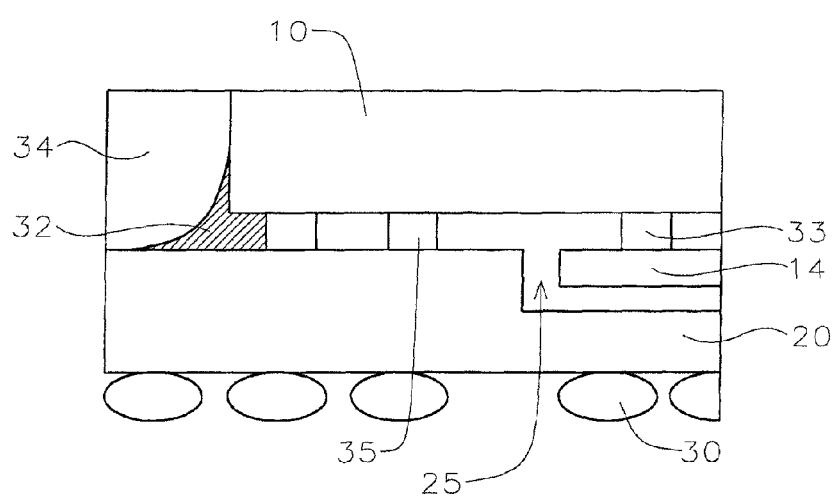
FIG. 5 is an enlarged cross-sectional representation of a portion of FIG. 4.

FIG. 5 is an enlarged portion of the cross-section of FIG. 4. There is shown:
1) Laminate substrate 20
2) Power management chip 10.
3) IPD chip 14.
4) Power management to substrate interconnect via flip chip attach 35.
5) IPD to power management interconnect micro bumps 33.
6) Flip Chip attach first underfill 32.
7) Epoxy Molding Compound 34.
8) Substrate cavity 25 filled with second underfill.
9) BGA solder balls 30.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a mother and daughter integrated circuit device comprising:
   providing a mother die having an active surface;
   providing a daughter die having an active surface wherein said daughter die is smaller than said mother die in all dimensions;
   directly connecting said active surface of said daughter die to said active surface of said mother die by microbumps resulting in a pyramid die stack;
   providing a laminate substrate having a rectangular cavity drilled therein wherein said cavity corresponds to a size and position of said daughter die in relation to said mother die, and wherein there is no opening into said cavity from an opposite side of said substrate; and
   attaching said pyramid die stack to said substrate by copper pillars using a flip chip method wherein said daughter die fits into said cavity, wherein said daughter die is not attached to said substrate, but is surrounded by said cavity, and wherein a first underfill surrounds said mother die, and wherein a second underfill fills said cavity around said daughter die.

2. The method according to claim 1 wherein said mother die is a power management circuit chip.

3. The method according to claim 1 wherein said daughter die is an integrated passive device containing at least one passive device.

4. The method according to claim 3 wherein said at least one passive device is chosen from the group containing a capacitor, a resistor, an inductor, a balun, and a filter.

5. The method according to claim 1 wherein said cavity is drilled by a mechanical drilling process or a laser drilling process.

6. The method according to claim 1 wherein said substrate is a ball grid array or a land grid array substrate.

7. A method of fabricating an integrated passive device comprising:
   providing a first die containing at least one power management device;
   providing a second die containing at least one passive device wherein said second die is smaller than said first die;
   directly connecting an active surface of said second die to an active surface of said first die resulting in a die stack;
   providing a substrate having a rectangular cavity drilled therein wherein said cavity corresponds to a size and position of said second die in relation to said first die;
   attaching said die stack to said substrate using a flip chip method wherein said second die fits into said cavity, wherein said second die is not attached to said substrate, but is surrounded by said cavity;
   providing a first underfill surrounding said first die;
   thereafter providing a second underfill filling said savity around said second die; and
   thereafter coating an epoxy molding compound over said die stack.

8. The method according to claim 7 wherein said at least one passive device is chosen from the group containing a capacitor, a resistor, an inductor, a balun, and a filter.

9. The method according to claim 7 wherein said directly connecting said active surface of said second die to said active surface of said first die comprises micro bumps.

10. The method according to claim 7 wherein said cavity is drilled by a mechanical drilling process or by a laser drilling process.

11. The method according to claim 7 wherein said substrate is a ball grid array or a land grid array substrate.

12. The method according to claim 7 wherein said attaching said die stack to said substrate comprises copper pillar interconnects.

13. A method of fabricating an integrated passive device comprising:
providing a first die and a second die wherein said second die is smaller than said first die in all dimensions;
directly connecting an active surface of said second die to an active surface of said first die resulting in a die stack;
providing a substrate having a rectangular cavity laser drilled therein wherein said cavity corresponds to a size and position of said second die in relation to said first die;
attaching said die stack to said substrate using a flip chip method wherein said second die fits into said cavity, wherein said second die is not attached to said substrate, but is surrounded by said cavity;
providing a first underfill surrounding said first die;
thereafter providing a second underfill filling said cavity around said second die; and
thereafter coating an epoxy molding compound over said die stack.

14. The method according to claim 13 wherein said first die is a power management circuit chip.

15. The method according to claim 13 wherein said second die is an integrated passive device containing at least one passive device.

16. The method according to claim 15 wherein said at least one passive device is chosen from the group containing a capacitor, a resistor, an inductor, a balun, and a filter.

17. The method according to claim 13 wherein said directly connecting said active surface of said second die to said active surface of said first die comprises micro bumps.

18. The method according to claim 13 wherein said substrate is a ball grid array or a land grid array substrate.

19. The method according to claim 13 wherein said attaching said die stack to said substrate comprises copper pillar interconnects.

20. The method according to claim 13 wherein said substrate is a laminate substrate having a Bismaleimide Triazine (BT) core.

* * * * *